United States Patent
Senapati et al.

(10) Patent No.: US 9,230,913 B1
(45) Date of Patent: Jan. 5, 2016

(54) METALLIZATION LAYERS CONFIGURED FOR REDUCED PARASITIC CAPACITANCE

(71) Applicant: GLOBALFOUNDRIES Inc., Grand Cayman (KY)

(72) Inventors: Biswanath Senapati, Mechanicville, NY (US); Jagar Singh, Clifton Park, NY (US); Karthik Chandrasekaran, Albany, NY (US)

(73) Assignee: GLOBALFOUNDRIES INC. (KY)

( * ) Notice: Subject to any disclaimer, the term of this patent is extended or adjusted under 35 U.S.C. 154(b) by 0 days.

(21) Appl. No.: 14/457,155

(22) Filed: Aug. 12, 2014

(51) Int. Cl.
*H01L 21/30* (2006.01)
*H01L 23/528* (2006.01)
*H01L 23/522* (2006.01)
*H01L 21/768* (2006.01)

(52) U.S. Cl.
CPC ........ *H01L 23/528* (2013.01); *H01L 21/76897* (2013.01); *H01L 23/5222* (2013.01)

(58) Field of Classification Search
CPC ................ H01L 2924/00; H01L 2224/16225; H01L 2224/32225; H01L 2224/73204; H01L 2924/13091; H01L 27/1225; H01L 29/78; H01L 27/124; H01L 2924/00012; H01L 2924/01006; H01L 29/7869; H01L 21/02565

USPC ................ 257/415, 386, E21.19, E29.255; 438/586, 462

See application file for complete search history.

(56) References Cited

U.S. PATENT DOCUMENTS

| | | | |
|---|---|---|---|
| 7,821,110 B2 | 10/2010 | Kim et al. | |
| 8,138,563 B2 | 3/2012 | Cho et al. | |
| 8,273,648 B2 | 9/2012 | Cho et al. | |
| 2010/0127355 A1* | 5/2010 | Mariani et al. | ................ 257/620 |
| 2010/0182078 A1* | 7/2010 | Cantoni | ........................ 327/581 |

* cited by examiner

*Primary Examiner* — Mark A Laurenzi
(74) *Attorney, Agent, or Firm* — Heslin, Rothenberg, Farley & Mesiti P.C.

(57) ABSTRACT

Structures and methods to minimize parasitic capacitance in a circuit structure are provided. The structure may include a substrate supporting one or more circuits and one or more metallization layers above the substrate. The metallization layer includes a conductive pattern defined by an array of conductive fill elements, where the conductive fill elements of the array are discrete, electrically isolated elements sized to satisfy, at least in part, a pre-defined minimum area-occupation ratio for a chemical-mechanical polishing of the metallization layer, and to minimize parasitic capacitance within the metallization layer, as well as minimize parasitic capacitance between the metallization layer and the circuit, and if multiple metallization layers are present, between the layers.

20 Claims, 5 Drawing Sheets

US 9,230,913 B1

METALLIZATION LAYERS CONFIGURED FOR REDUCED PARASITIC CAPACITANCE

FIELD OF THE INVENTION

The present invention generally relates to circuit structures, and more specifically, to structures and methods of fabrication which minimize parasitic capacitance in, for instance, a circuit structure.

BACKGROUND

The continually increasing demand for smaller circuit structures and faster device performance continues to drive innovation in improving design and performance of integrated circuits. As the size of circuit structures continues to shrink, parasitic capacitance induced in the circuit structures is increasingly becoming prominent as a source of performance degradation.

SUMMARY OF THE INVENTION

The shortcomings of the prior art are overcome and additional advantages are provided through the provision, in one aspect, of a structure that includes: a substrate including at least one circuit; a metallization layer disposed above the substrate, the metallization layer including: a conductive pattern defined, at least in part, by an array of conductive fill elements, the conductive fill elements of the array being discrete, electrically isolated elements; wherein the conductive fill elements of the array are sized to, at least in part, satisfy a pre-defined minimum area-occupation ratio for a chemical-mechanical polishing of the metallization layer; and wherein the conductive pattern is configured to minimize parasitic capacitance within the metallization layer and minimize parasitic capacitance between the metallization layer and the at least one circuit.

Also provided herein is a method including: providing a substrate including at least one circuit; providing a metallization layer above the substrate; forming a conductive pattern in the metallization layer, the forming including: arraying conductive fill elements to define, at least in part, the conductive pattern, the conductive fill elements of the array being discrete, electrically isolated elements, the arraying including: sizing the conductive fill elements of the array to, at least in part, satisfy a pre-defined minimum area-occupation ratio for a chemical-mechanical polishing of the metallization layer; and configuring the conductive pattern to minimize parasitic capacitance within the metallization layer and minimize parasitic capacitance between the metallization layer and the at least one circuit Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
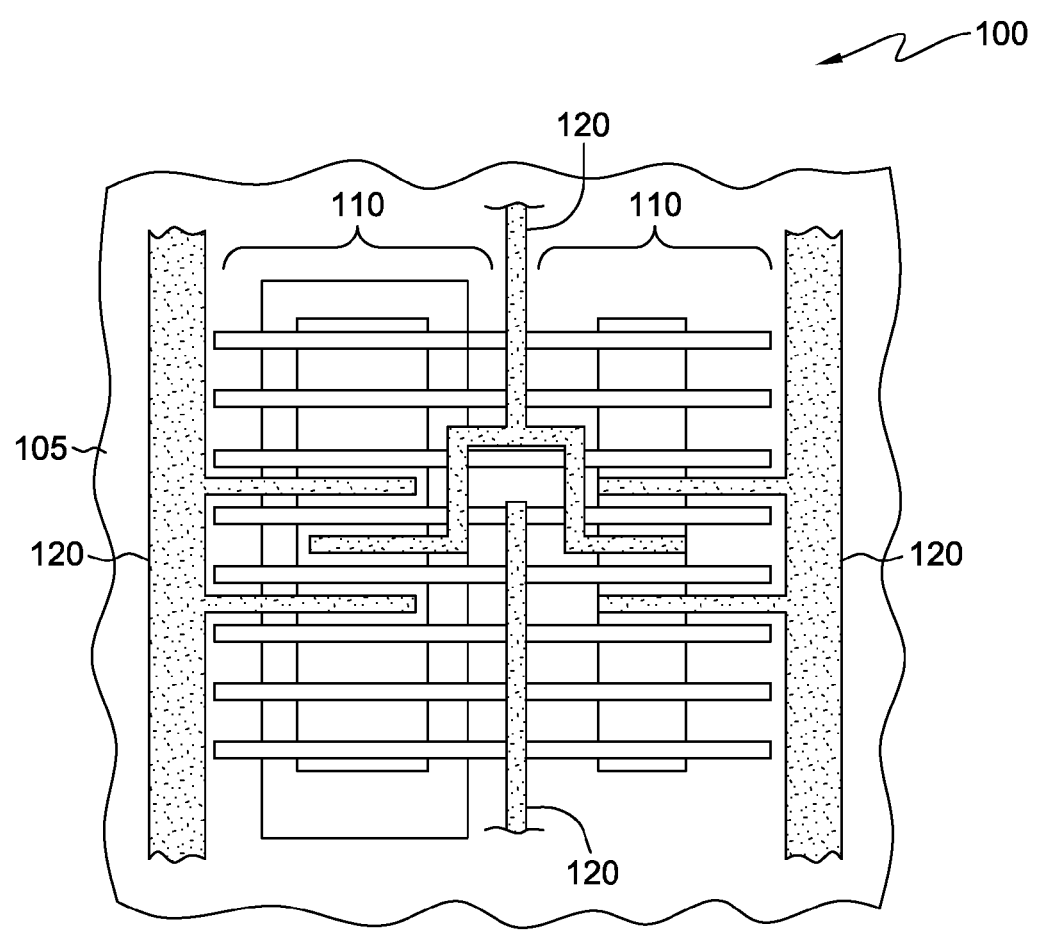
FIG. 1A depicts one embodiment of a structure including at least one circuit as an exemplary structure included in one or more conventional circuit structures described herein and in one or more aspects of the present invention.

Many circuit structures make use of one or more metallization layers, also referred to as Back End of Line (BEOL) layers, to form conductive electrical connections between integrated circuits and other circuit structure components. FIG. 1A is a top-down view of one embodiment of a structure 100 including a substrate 105 with an integrated circuit 110 and a metallization layer 120 above substrate 105 and integrated circuit 110. It may be understood that the integrated circuit 110 depicted in FIG. 1A is one example integrated circuit provided for illustrative purposes only, in this figure and in following figures, and does not limit the scope of the invention disclosed herein. A metallization layer, such as metallization layer 120, may include a dielectric material and one or more active conductive elements, as depicted in FIG. 1A, formed in portions of the dielectric material. Active conductive elements of a metallization layer, as referenced herein, are conductive elements of the metallization layer with electrical connection to one or more other circuit structure components, such as a portion of an integrated circuit 110 and/or to conductive elements of separate metallization layers, and so on.

Figure 1B:
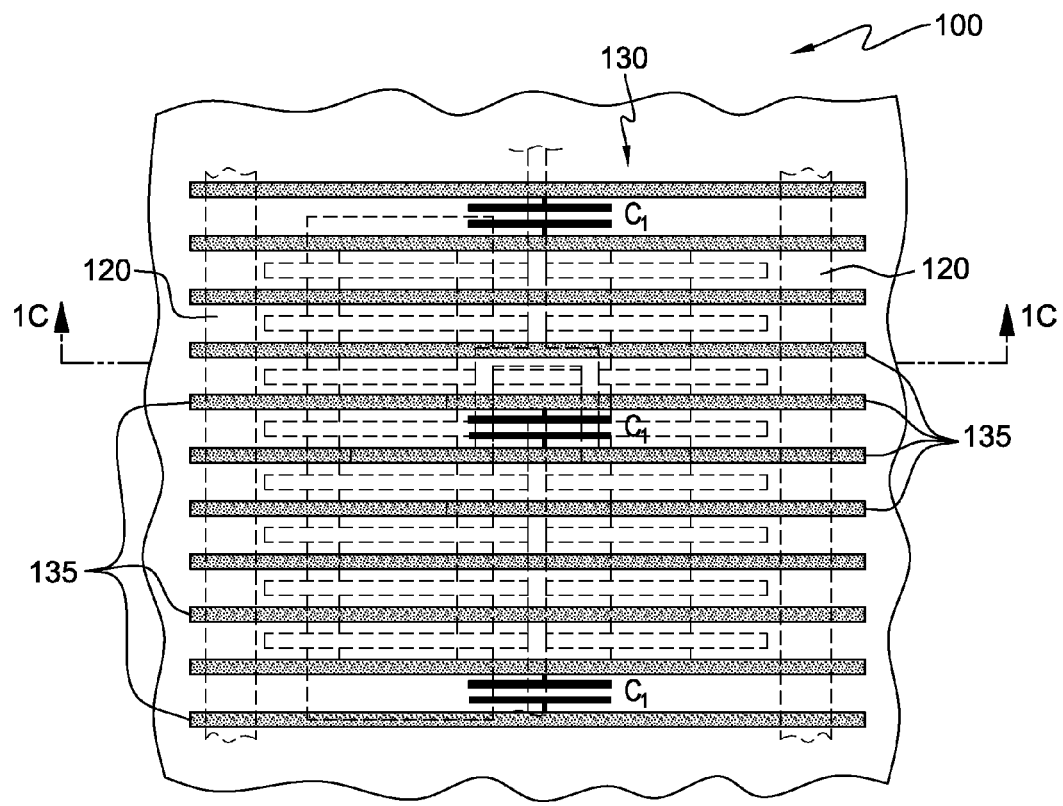
FIG. 1B depicts one embodiment of a structure such as depicted in FIG. 1A, including a metallization layer that includes a conventional conductive fill pattern, highlighting problems with the use of conventional conductive fill patterns.

FIG. 1B depicts the structure 100 of FIG. 1A with an additional metallization layer 130 including conductive fill elements 135 disposed above integrated circuit 110 and metallization layer 120. Conductive fill elements, as referenced herein, are conductive elements in a metallization layer, generally of the same metal material as the active conductive elements, but without electrical connection to other circuit structure components. Techniques for fabricating metallization layers may include a chemical-mechanical polishing (CMP) process applied to the layer. CMP processing may require that the metallization layer contain at least a pre-defined minimum density of metal elements relative to the dielectric material of the layer. The pre-defined minimum density is often called an "area-occupation ratio" or "CMP ratio." For many metallization layers, the minimum density of metal or minimum area-occupation ratio may be about 15%. As the active conductive elements in a metallization layer alone may not satisfy the minimum area-occupation ratio, a plurality of conductive fill elements may be added to the metallization layer to meet or exceed the pre-defined minimum area-occupation ratio, thereby enabling CMP processing. FIG. 1B depicts one example pattern of conductive fill elements 135 that may be included in metallization layer 130, in which conductive fill elements 135 are a plurality of parallel conductive lines disposed above substrate 105 and integrated circuit 110. Conductive fill elements 135 may be sized and spaced to produce an area-occupation ratio of about 23% up to about 53%, depending on the density of metal lines and the design requirements of the metallization layer. FIG. 1B depicts one example pattern of conductive fill elements 135 having an area-occupation ratio of about 23%.

Conductive fill elements may also induce parasitic capacitance in a circuit structure, as illustrated in part by FIG. 1B. Minimizing parasitic capacitances in circuits may generally be desirable as parasitic capacitance can degrade performance of a circuit structure by, for example, inducing switching delays in the circuit or increasing minimum operating voltages for the circuit. For example, ring oscillator circuit structures may be designed to operate at a specific switching frequency. Small increases in parasitic capacitance can add significant time delays to in the ring oscillator's switching frequency that may be difficult to account for and correct in the circuit structure design. As circuit structures continue to shrink, performance of integrated circuits has become increasingly susceptible to parasitic capacitances caused by conductive fill patterns in metallization layers. Capacitance generally is a function of an overlap area between two conductive elements separated by a dielectric material. As FIG. 1B illustrates, a capacitance C1 between adjacent conductive fill elements 135 may be relatively large due to the large overlap area between adjacent conductive fill elements. Capacitance between all adjacent conductive fill elements 135 contribute to an overall capacitance within metallization layer 130, which may contribute to a large parasitic capacitance in underlying circuit 110.

Figure 1C:
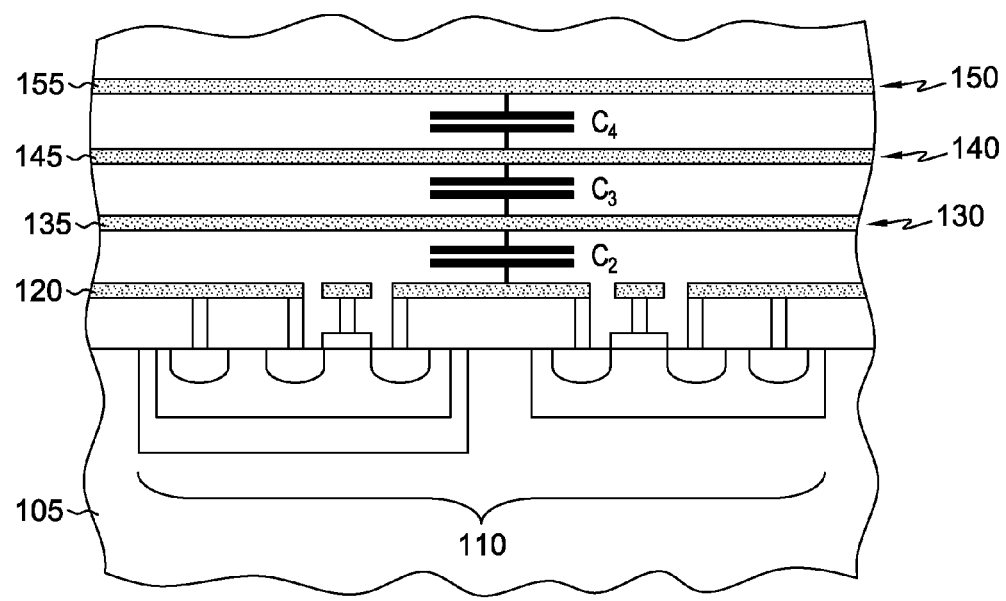
FIG. 1C depicts a cross-sectional view of the structure of FIG. 1B, taken along line 1C-1C, illustrating further problems with the use of conventional conductive fill patterns.

In addition to the capacitance within a metallization layer, capacitance between a metallization layer and the circuit, as well as capacitance between metallization layers, may also contribute to parasitic capacitance in a circuit, as FIG. 1C depicts. FIG. 1C is a cross-sectional view of a portion of structure 100 of FIG. 1B, depicting multiple metallization layers 120, 130, 140, and 150 above integrated circuit 110. In the example embodiment depicted, each of metallization layers 130, 140, and 150 may include conductive fill elements 135, 145, 155 similar to conductive fill elements 135 as described above in FIG. 1B. Metallization layer 120 may also include conductive fill elements for CMP processing purposes. Capacitances C2, C3, and C4 between metallization layers 120, 130, 140, and 150 may be relatively large due to a large overlap area between conductive fill elements 135, 145, 155 of adjoining metallization layers and/or metallization layer 120, resulting in a correspondingly large parasitic capacitance in circuit 110. For simplicity, FIG. 1C depicts only three additional metallization layers above the first metallization layer 120 connected to integrated circuit 110. It may be understood that many circuit structures include seven or more metallization layers, and each metallization layer may also require conductive fill elements to be included for CMP processing purposes, contributing to additional parasitic capacitance. As circuit sizes continue to shrink, parasitic capacitance in metallization layers and between metallization layers may become an increasingly significant factor in the performance and design of integrated circuit structures.

Thus, provided herein, in one aspect, is a structure designed to address one or more shortcomings of the prior art described herein, the structure including: a substrate including at least one circuit; a metallization layer disposed above the substrate, the metallization layer including: a conductive pattern defined, at least in part, by an array of conductive fill elements, the conductive fill elements of the array being discrete, electrically isolated elements; wherein the conductive fill elements of the array are sized to, at least in part, satisfy a pre-defined minimum area-occupation ratio for a chemical-mechanical polishing of the metallization layer; and wherein the conductive pattern is configured to minimize parasitic capacitance within the metallization layer and minimize parasitic capacitance between the metallization layer and the at least one circuit.

Figure 2A:
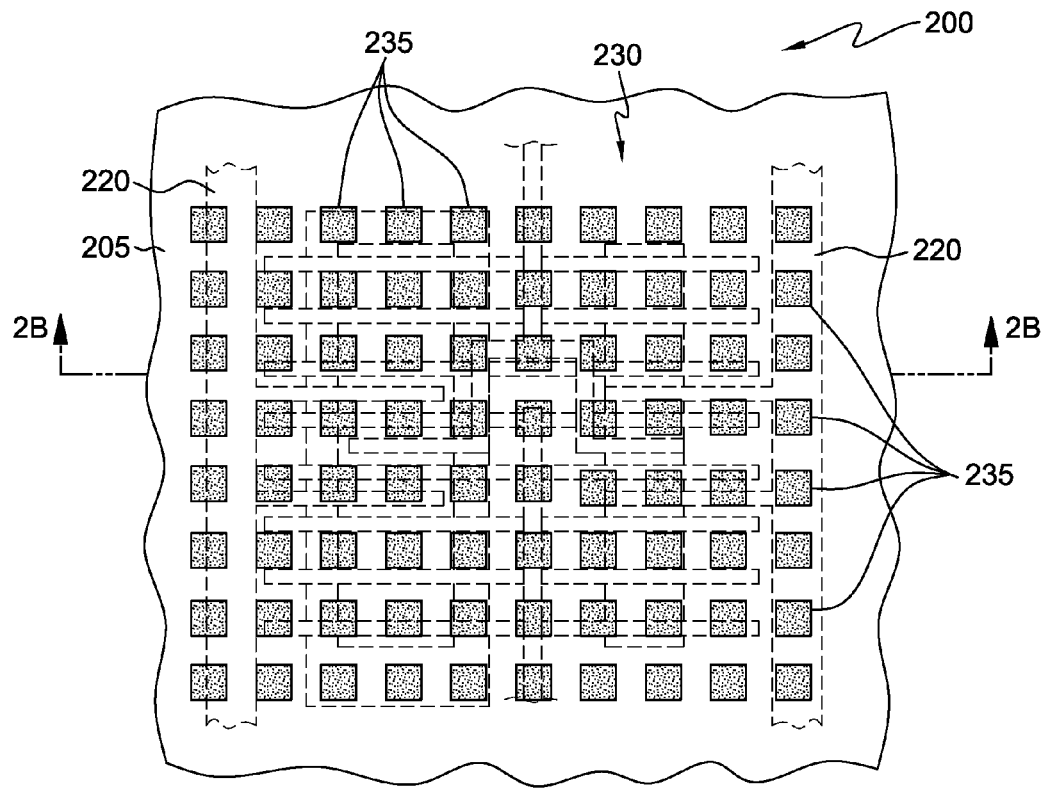
FIG. 2A depicts one embodiment of a structure including a metallization layer with a conductive fill pattern designed to address one or more of the capacitance problems identified in FIGS. 1B-1C, in accordance with one or more aspects of the present invention.

FIG. 2A is a top-down view of one embodiment of at least a portion of a structure 200 including a substrate 205 with at least one circuit 210 and a metallization layer 230 above substrate 205 circuit 210, in which metallization layer 230 provided above substrate 205 includes a conductive pattern designed to address one or more of the issues described above. In one embodiment, metallization layer 230 may be a first metallization layer provided over a second metallization layer 220. In another embodiment, metallization layer 230 may be a metallization layer in contact with at least one circuit 210, that is, metallization layer 230 may include active conductive elements that contact at least one circuit 210. The conductive pattern of metallization layer 230 is defined by an array of conductive fill elements 235 that are discrete and electrically isolated elements. The conductive pattern may be configured to minimize parasitic capacitance within metallization layer 230 as well as minimize capacitance between metallization layer 230 and at least one circuit 210. In embodiments in which metallization layer 230 is in contact with at least one circuit 210, the conductive pattern may be further configured to minimize parasitic capacitance between metallization layer 230 and substrate 205. Conductive fill elements 235 in the array may also be sized and shaped to satisfy a pre-defined minimum area-occupation ratio for a chemical-mechanical polishing (CMP) process for metallization layer 230, as described herein.

It may be understood by those with skill in the art that metallization layers in a circuit structure may commonly be labeled according to the order of the layers in the circuit structure, e.g., "M1" refers to the metallization layer in contact with integrated circuit structures on a substrate, "M2" refers to the metallization layer above M1, and so on. The terms "metallization layer," "first metallization layer" and "second metallization layer," as used herein, may refer to any metallization layer in a circuit structure and may or may not correspond to the M1 layer, the M2 layer, and so on. Thus, in at least one embodiment, metallization layer 230 may correspond to an M1 layer of the circuit structure. In another embodiment, metallization layer 230 may be any one of an M2 layer, M3 layer, etc. of the circuit structure.

In one embodiment, as depicted in FIG. 2A, the conductive pattern of metallization layer 230 may include a plurality of rows of conductive fill elements 235, in which the conductive fill elements of at least one row are uniformly spaced apart by a pre-defined distance. In one example, the at least one row and an adjoining row may also be spaced apart by the pre-defined distance. Arranging conductive fill elements 235 in a uniform spacing relationship within a row, as well as arranging rows in the uniform spacing relationship, may advantageously facilitate minimizing parasitic capacitance within metallization layer 230, as well as minimizing parasitic capacitance between metallization layer 230 and at least one circuit 210. In one exemplary embodiment, the pre-defined distance may be at least 0.18 µm. In another exemplary embodiment, as depicted in FIG. 2A, the conductive fill elements 235 of a first row may be aligned in at least one direction with the conductive fill elements 235 of a second row, the second row being adjacent the first row, to, at least in part, form a plurality of columns of conductive fill elements 235, in which the plurality of columns are also spaced apart by the pre-defined distance.

In one example embodiment, at least one conductive fill element of the conductive fill elements 235 may have a regular polygon shape, such as a square shape as depicted in FIG. 2A. A side length of the square shape may be, for instance, less than or equal to 0.24 µm. In another embodiment, the conductive fill elements 235 of metallization layer 230 may be homogeneously sized and shaped.

In one exemplary embodiment, the conductive fill pattern of metallization layer 230 may have an area-occupation ratio of 33% or less. An area-occupation ratio of 33% may be achieved, for example, where the conductive fill elements 235 are homogeneously sized and shaped to have a square shape, with the side lengths of the square shapes sized at about 0.24 µm, and the uniform pre-defined distance is about 0.18 µm. In this exemplary embodiment, the conductive fill pattern may reduce parasitic capacitance within metallization layer 230 and between at least one circuit 210 and metallization layer 230 below parasitic capacitances that are produced by a conventional conductive fill pattern, such as the conductive fill pattern depicted in FIG. 1B. The lower capacitance in metallization layer 230 may be achieved despite the area-occupation ratio of the conductive fill pattern in metallization layer 230 being higher than an area-occupation ratio (of about 23%) of the conductive fill pattern depicted in FIG. 1B, due to the reduced overlap area between conductive fill elements 235. Thus, it may be possible through the use of the structures disclosed herein to achieve a conductive fill pattern for a metallization layer 230 that produces lower parasitic capacitances and better facilitates chemical-mechanical polishing processes.

Figure 2B:
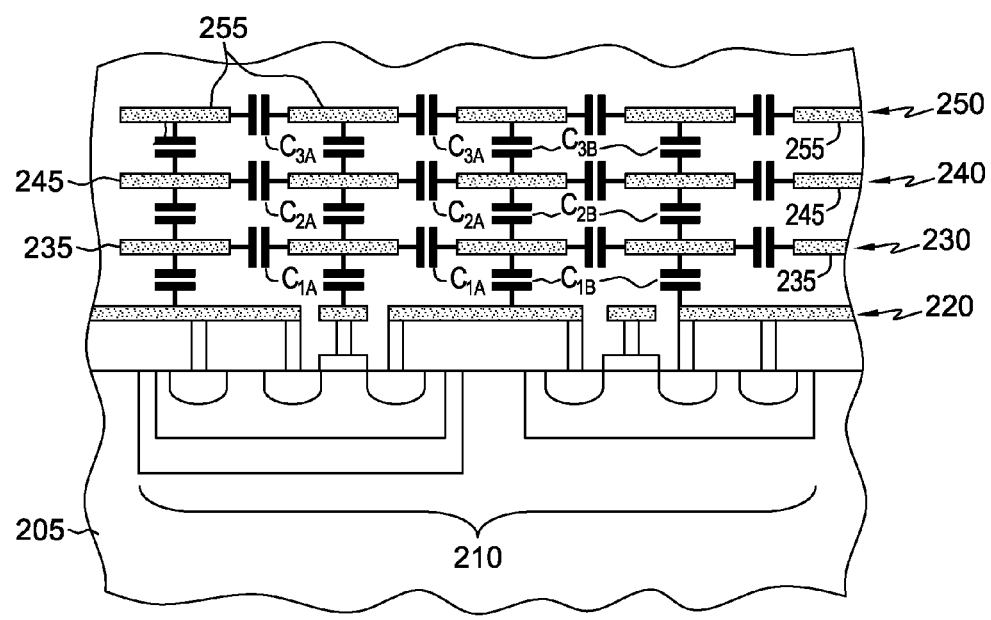
FIG. 2B depicts a cross-sectional view of the structure of FIG. 2A, taken along line 2B-2B, in which the conductive fill pattern of FIG. 2A is included at multiple metallization layers of the structure to further address one or more of the problems identified in FIGS. 1B-1C, in accordance with one or more aspects of the present invention.

FIG. 2B is a cross-sectional view of a portion of structure 200 of FIG. 2A, depicting multiple metallization layers 220, 230, 240, and 250 above at least one circuit 210. As depicted in FIG. 2B, metallization layer 220 is electrically connected to at least one circuit 210. In one embodiment, metallization layer 230 may be a first metallization layer 230 and structure 200 may include a second metallization layer 240, wherein the conductive pattern of first metallization layer 230 is a first conductive pattern defined by an array of first conductive fill elements 235. The second metallization layer 240 includes a second conductive pattern defined by an array of second conductive fill elements 245, the second conductive fill elements 245 being discrete electrically isolated elements. The second conductive fill elements 245 of the array, similar to the first conductive fill elements 235 of the first metallization layer 230, may be sized to satisfy a pre-defined minimum area-occupation ratio for a chemical-mechanical polishing process of the second metallization layer. The second conductive pattern may be configured to minimize parasitic capacitance within second metallization layer 240, to minimize parasitic capacitance between second metallization layer 240 and first metallization layer 230, and minimize parasitic capacitance between second metallization layer 240 and the at least one circuit 210.

In one example, the second conductive pattern of second metallization layer 240 may include a plurality of rows of the second conductive fill elements 245. In one example, the pre-defined distance between first conductive fill elements 235 is a first pre-defined distance, and the second conductive fill elements 245 of at least one row of the plurality of rows may be uniformly spaced apart by a second pre-defined distance. The second pre-defined distance may, in one example, be the same as the first pre-defined distance of first metallization layer 230. In another example, the at least one row and an adjoining row of the plurality of rows may also be spaced apart by the second pre-defined distance.

In one embodiment, as depicted at least in part by the example in FIG. 2B, the first conductive pattern of first metallization layer 230 and second conductive pattern of second metallization layer 240 may be arrayed so that first conductive fill elements 235 of the first conductive pattern are aligned in at least one direction with second conductive fill elements 245 of the second conductive pattern. The first conductive fill elements 235 and second conductive elements 245 may, in one exemplary embodiment, be aligned in at least two directions to, at least in part, form a plurality of vertically aligned columns of first conductive fill elements and second conductive fill elements, as depicted in part by FIG. 2B. In one alternative embodiment, the first conductive pattern of first metallization layer 230 and second conductive pattern of second metallization layer 240 may be arrayed so that the first conductive fill elements 235 of the first conductive pattern are offset in at least one direction from the second conductive fill elements 245 of the second conductive pattern.

It may be understood that, in the descriptions above, metallization layers 230 and 240 are labeled "first metallization layer" and "second metallization layer," respectively, by way of example only. Any of metallization layers 220, 230, 240, or 250 may be considered a "first metallization layer" or a "second metallization layer," and may include a conductive fill pattern for minimization of parasitic capacitances as described herein. As well, it may be understood that FIG. 2B, for simplicity, depicts only four metallization layers for structure 200, however, many circuit structures include seven or more metallization layers. The conductive fill patterns disclosed herein may be advantageously used in any or all metallization layers of a circuit structure to minimize parasitic capacitances and to satisfy a minimum area-occupation ratio of the metallization layers for CMP purposes.

By way of example, FIG. 2B illustrates minimized capacitances C1A, C2A, C3A within metallization layers 230, 240, 250, respectively, that may result from use of the conductive fill patterns described herein. FIG. 2B also illustrates, by way of example, the minimized capacitances C1B, C2B, C3B between metallization layers 220, 230, 240, 250, respectively, that also may result from use of the conductive fill patterns described herein. In alternative embodiments, a structure 200 may include a first metallization layer including a conductive fill pattern as described herein, such as metallization layer 230, and a second metallization layer that includes a non-optimized conductive fill pattern, such as the conductive fill pattern described in FIG. 1B. Such alternative embodiments may not, however, optimally achieve minimized parasitic capacitances within a circuit structure. Greater minimization of parasitic capacitances may be achieved in exemplary embodiments by including embodiments of the conductive fill patterns described herein throughout the metallization layers of a circuit structure.

In at least one embodiment, minimizing parasitic capacitance in a circuit 210 may also reduce a switching delay in the circuit 210. The circuit may include, for example, a ring oscillator, an RF circuit, a mixed signal high-speed circuit such as an analog-to-digital converter, and so on. For example, in at least one embodiment of structure 200 the at least one circuit 210 may include a ring oscillator. Use of the conductive fill patterns as described herein may produce a parasitic capacitance of, in one instance, about 0.08 fF, which may correspondingly increase switching delay by 2.5% in the ring oscillator circuit 210. The increase in switching delay given is a percent increase over an inherent switching delay of the ring oscillator present without metallization layers. By way of contrasting example, using the conductive fill pattern depicted in FIG. 1B throughout the metallization layers of the circuit structure may increase parasitic capacitance in the ring oscillator by about 0.09 fF or more, resulting in a switching delay increase of 3.1% or more in ring oscillator circuit 210. Minimizing parasitic capacitances in a circuit 210 by even small amounts may thus have significant impact on the performance of integrated circuit structures.

Figure 2C:
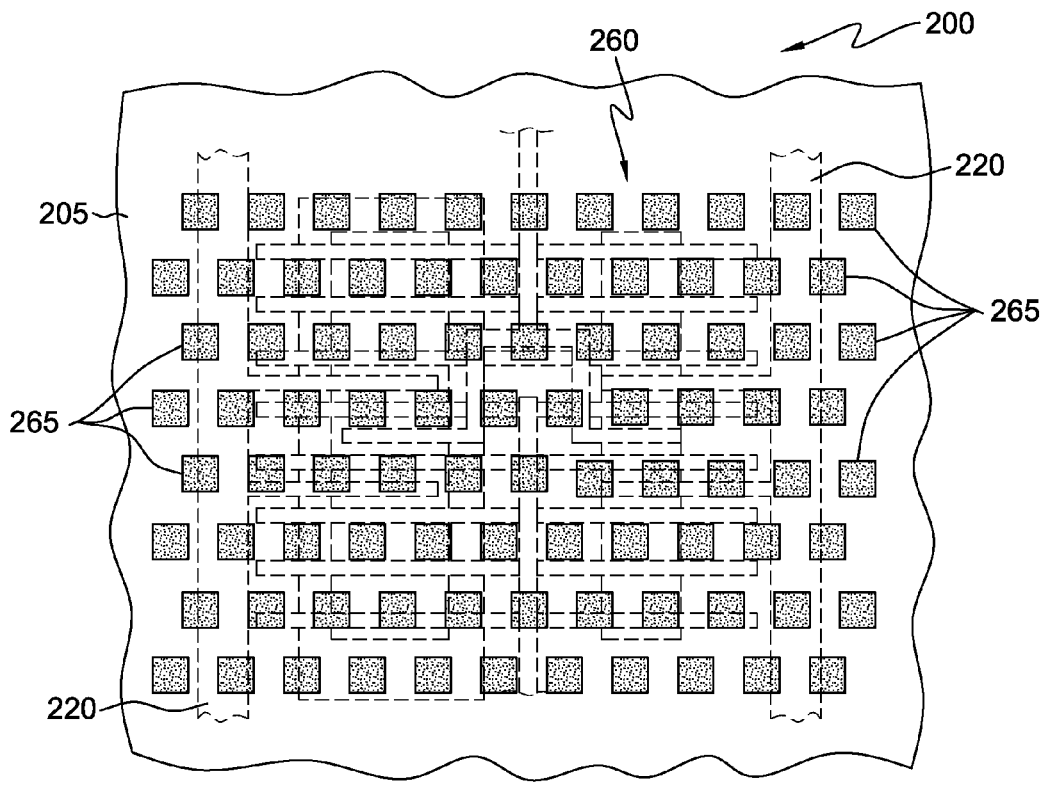
FIGS. 2C-2D depict alternative embodiments of conductive fill patterns for a structure that may further address one or more of the problems identified in FIGS. 1B-1C, in accordance with one or more aspects of the present invention.

FIG. 2C depicts an alternative embodiment of structure 200 of FIG. 2A, including a metallization layer 260 in which conductive fill elements 265 are disposed in a plurality of rows, including at least a first row and a second row, in which the conductive elements of the first row are transversely offset from the conductive fill elements of the second row. In one example, as depicted in FIG. 2C, the offset between the first row and the second row may align the conductive fill elements 265 of the first row with spaces intermediate the conductive fill elements 265 of the second row. Offsetting the conductive fill elements 265 of adjacent rows may facilitate minimizing parasitic capacitances in some instances, depending in part on the layout of integrated circuit structure 210, the layout of active conductive elements of metallization layer 260, and layouts of other metallization layers included in structure 200.

Figure 2D:
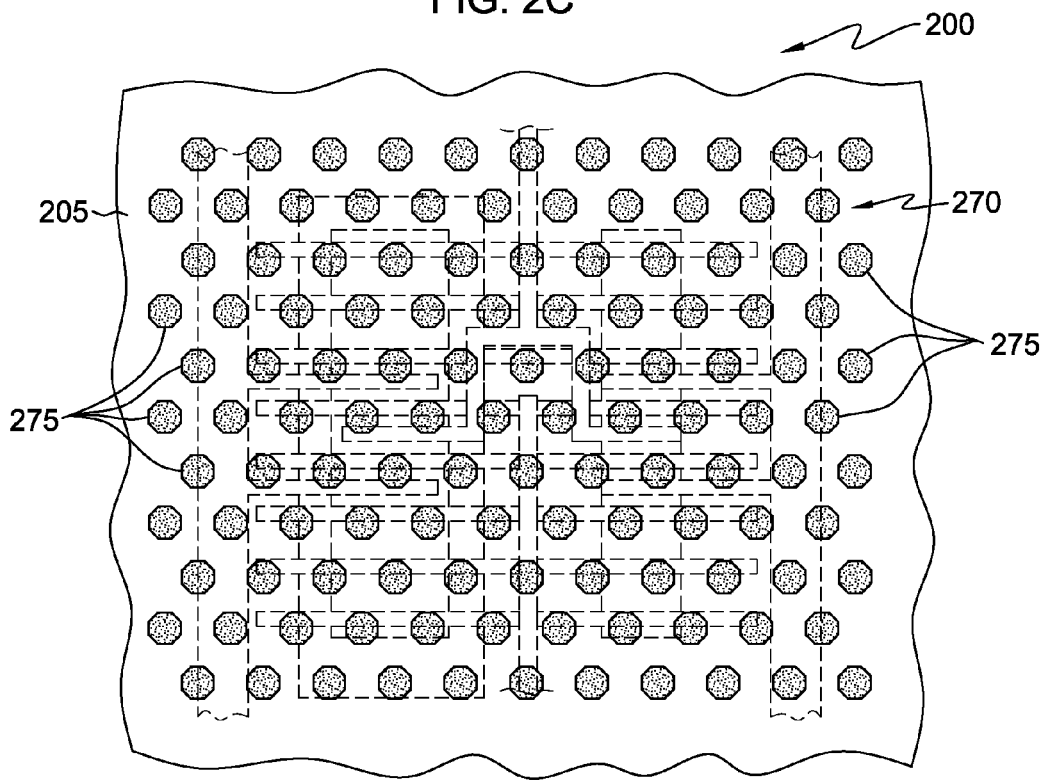

FIG. 2D depicts another alternative embodiment of structure 200 of FIG. 2A, including a metallization layer 270 in which conductive fill elements 275 have an octagon shape rather than a square shape. The embodiment of structure 200 depicted in FIG. 2A illustrates one example of alternative regular polygon shapes that may be used as conductive fill elements 275 in a metallization layer 270. It may be understood that other alternative regular polygon shapes may also be used advantageously to minimize parasitic capacitances.

Figure 3A:
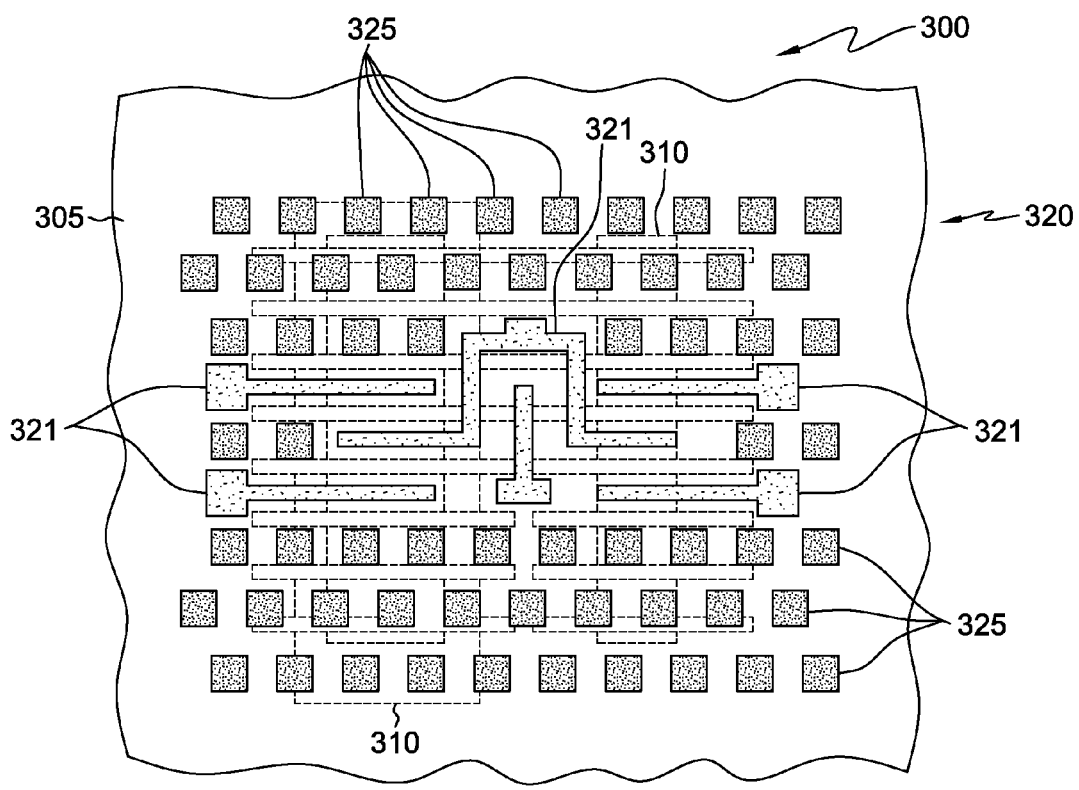
FIG. 3A depicts one embodiment of a metallization layer including active conductive elements and a conductive fill pattern disposed in relation to the active conductive elements, in accordance with one or more aspects of the present invention; and, FIG. 3B depicts one embodiment of an additional metallization layer, disposed above the metallization layer of FIG. 3A, including active conductive elements and a conductive fill pattern disposed in relation to the active conductive elements of the additional metallization layer, in accordance with one or more aspects of the present invention.

FIG. 3A depicts one embodiment of a portion of a structure 300 including at least one circuit 310 and a first metallization layer 320 above integrated circuit structure 310, depicting both active conductive elements 321 and conductive fill elements 325 of metallization layer 320, in accordance with one or more aspects of the present invention. In one example, first metallization layer 320 may correspond to an M1 metallization layer of structure 300. First metallization layer 320 may include active conductive elements 321 that may contact other layers of a circuit structure, such as at least one circuit 310 or additional metallization layers, as described below. Conductive fill elements 325 may be arrayed as described herein, and may be further arrayed in relation to active conductive fill elements 321 to optimally minimize parasitic capacitance between conductive fill elements 325 and active conductive elements 321. By way of example, conductive fill elements 325 may be arrayed similarly to conductive fill elements 265 in FIG. 2C, in which the conductive fill elements 325 of at least one row are offset in at least one direction from the conductive fill elements 325 of an adjacent row. In another example, conductive fill elements 325 of at least one row may be aligned in at least one direction with the conductive fill elements 325 of the adjacent row to, at least in part, form a plurality of columns of conductive fill elements 325.

Figure 3B:
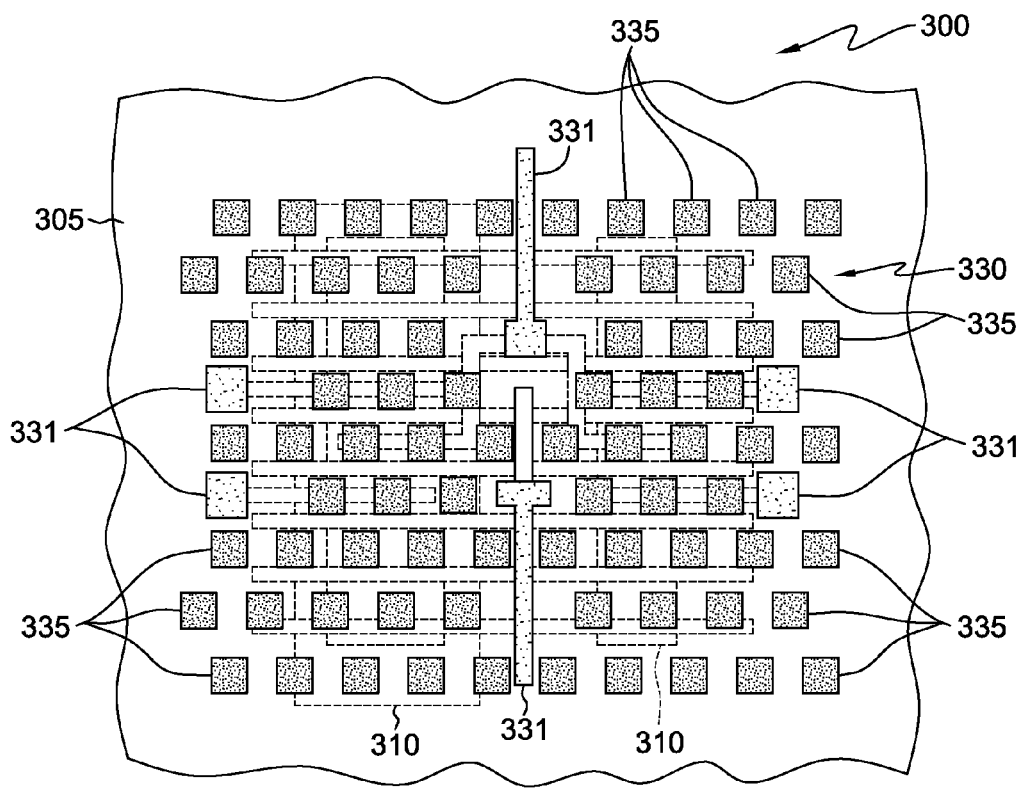

FIG. 3B depicts the structure 300 of FIG. 3A with a second metallization layer 330 above at least one circuit 310 and first metallization layer 320, in which active conductive elements 321 are first active conductive elements and conductive fill elements 325 are first conductive fill elements. The second metallization layer 330 may include second active conductive elements 331 and second conductive fill elements 335 arranged in relation to second active conductive elements 331, in accordance with one or more aspects of the present invention. In one example, second metallization layer 320 may correspond to an M2 metallization layer of structure 300. Second metallization layer may include second active conductive elements 331 that may contact other layers of a circuit structure, such as first active conductive elements 321 of first metallization layer 320 or additional metallization layers. Second conductive fill elements 335 may be arrayed as described herein above and further arrayed in relation to second active conductive fill elements 331 to optimally minimize parasitic capacitances. In one example, conductive fill elements 325 may be arrayed similarly to the first conductive elements in FIG. 3A, and may further be arrayed so that second conductive elements 335 of the second conductive pattern align in at least one direction with first conductive elements 325 of the first conductive pattern, as depicted in FIG. 3B. In another example, the second conductive fill pattern may differ from the first conductive fill pattern, so that second conductive fill elements 335 in the second metallization layer 330 are offset in at least one direction from first conductive fill elements 325 in the first metallization layer. It may be understood by those with skill in the art that many alternative arrangements of first conductive fill elements 325 and second conductive fill elements 335 may be possible, and an optimal arrangement may depend in part on the pattern of active conductive elements 321, 331 in each metallization layer.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A structure comprising:
    a substrate comprising at least one circuit;
    a metallization layer disposed above the substrate, the metallization layer comprising:
        a conductive pattern defined, at least in part, by an array of conductive fill elements, the conductive fill elements of the array being discrete, electrically isolated elements;
        wherein the conductive fill elements of the array are sized to, at least in part, satisfy a pre-defined minimum area-occupation ratio for a chemical-mechanical polishing of the metallization layer; and,
        wherein the conductive pattern is configured to minimize parasitic capacitance within the metallization layer and minimize parasitic capacitance between the metallization layer and the at least one circuit.

2. The structure of claim 1, wherein the conductive pattern comprises a plurality of rows of the conductive fill elements, the conductive fill elements of at least one row of the plurality of rows being uniformly spaced apart by a pre-defined distance.

3. The structure of claim 2, wherein the at least one row and an adjoining row of the plurality of rows are also spaced apart by the pre-defined distance.

4. The structure of claim 2, wherein the plurality of rows comprise at least a first row and a second row, the second row being adjacent to the first row, and conductive fill elements of the first row are aligned in at least one direction with conductive fill elements of the second row to, at least in part, form a plurality of columns of conductive fill elements, wherein the plurality of columns are also spaced apart by the pre-defined distance.

5. The structure of claim 2, wherein the plurality of rows comprise at least a first row and a second row, the second row being adjacent to the first row, and conductive fill elements of the first row are offset in at least one direction from conductive fill elements of the second row.

6. The structure of claim 5, wherein conductive elements of the first row and conductive elements of the second row are offset in at least one direction so that a conductive element of the first row aligns with a space intermediate adjacent conductive elements of the second row.

7. The structure of claim 2, wherein the pre-defined distance is at least 0.18 μm.

8. The structure of claim 1, wherein the conductive fill elements are homogeneously sized and shaped.

9. The structure of claim 1, wherein at least one conductive fill element of the conductive fill elements has a regular polygon shape.

10. The structure of claim 9, wherein the regular polygon shape is a square shape.

11. The structure of claim 10, wherein a side length of the square shape is less than or equal to 0.24 μm.

12. The structure of claim 9, wherein the regular polygon shape is an octagon shape.

13. The structure of claim 1, wherein the conductive fill pattern has an area-occupation ratio of 33% or less.

14. The structure of claim 1, wherein the metallization layer is a first metallization layer, the conductive pattern is a first conductive pattern and the conductive fill elements comprise first conductive fill elements, the structure further comprising:
    a second metallization layer comprising a second conductive pattern defined, at least in part, by an array of second conductive fill elements, the second conductive fill elements being discrete, electrically isolated elements;
    wherein the second conductive fill elements of the array are sized to satisfy, at least in part, a pre-defined minimum area-occupation ratio for the chemical-mechanical polishing of the second metallization layer; and,
    wherein the second conductive pattern is configured to minimize parasitic capacitance within the second metallization layer, to minimize parasitic capacitance between the second metallization layer and the first metallization layer, and to minimize parasitic capacitance between the second metallization layer and the at least one circuit.

15. The structure of claim 14, wherein the pre-defined distance is a first pre-defined distance, and wherein the second conductive pattern comprises a plurality of rows of the second conductive fill elements, wherein the second conductive fill elements of at least one row of the plurality of rows are uniformly spaced apart by a second pre-defined distance, and the at least one row and an adjoining row of the plurality of rows are also spaced apart by the second pre-defined distance.

16. The structure of claim 14, wherein the first conductive pattern and the second conductive pattern are arrayed so that the first conductive fill elements of the first conductive pattern are aligned in at least one direction with the second conductive fill elements of the second conductive pattern.

17. The structure of claim 16, wherein the first conductive fill elements of the first conductive pattern are aligned in at least two directions with the second conductive fill elements of the second conductive pattern to, at least in part, form a plurality of vertically aligned columns of first conductive fill elements and second conductive fill elements.

18. The structure of claim 14, wherein the first conductive pattern and the second conductive pattern are arrayed so that the first conductive fill elements of the first conductive pattern are offset in at least one direction from the second conductive fill elements of the second conductive pattern.

19. The structure of claim 14, wherein the first conductive fill elements and the second conductive fill elements are homogeneously sized and shaped.

20. A method comprising:
providing a substrate comprising at least one circuit;
providing a metallization layer above the substrate;
forming a conductive pattern in the metallization layer, the forming comprising:
   arraying conductive fill elements in the metallization layer to define the conductive pattern, the conductive fill elements of the array being discrete, electrically isolated elements, the arraying comprising:
     sizing the conductive fill elements of the array to, at least in part, satisfy a pre-defined minimum area-occupation ratio for a chemical-mechanical polishing of the metallization layer; and,
     configuring the conductive pattern to minimize parasitic capacitance within the metallization layer and between the metallization layer and the at least one circuit.

\* \* \* \* \*